(12) United States Patent
Sample

(10) Patent No.: US 11,595,057 B2
(45) Date of Patent: Feb. 28, 2023

(54) REDUCING ERROR IN DATA COMPRESSION

(71) Applicant: The Government of the United States of America, as represented by the Secretary of the Navy, Arlington, VA (US)

(72) Inventor: John T. Sample, Pearl River, LA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/863,017

(22) Filed: Jul. 12, 2022

(65) Prior Publication Data

US 2022/0345154 A1    Oct. 27, 2022

Related U.S. Application Data

(60) Continuation of application No. 17/039,720, filed on Sep. 30, 2020, now Pat. No. 11,418,213, which is a division of application No. 16/378,766, filed on Apr. 9, 2019, now Pat. No. 11,025,273.

(60) Provisional application No. 62/654,741, filed on Apr. 9, 2018.

(51) Int. Cl.
*H03M 7/30* (2006.01)
*G06F 11/07* (2006.01)
*H04B 7/185* (2006.01)

(52) U.S. Cl.
CPC ......... *H03M 7/6041* (2013.01); *G06F 11/076* (2013.01); *G06F 11/0709* (2013.01); *H04B 7/185* (2013.01)

(58) Field of Classification Search
None
See application file for complete search history.

(56) References Cited

U.S. PATENT DOCUMENTS

| | | | | |
|---|---|---|---|---|
| 2003/0176974 | A1* | 9/2003 | Baliguet | G01V 1/247 702/14 |
| 2006/0075450 | A1* | 4/2006 | Haas | H04N 7/18 725/121 |
| 2013/0097128 | A1* | 4/2013 | Suzuki | G05B 23/0264 707/693 |
| 2019/0312591 | A1* | 10/2019 | Sample | G06F 11/076 |

* cited by examiner

*Primary Examiner* — Guerrier Merant
(74) *Attorney, Agent, or Firm* — US Naval Research Laboratory; Nigel R. Fontenot

(57) ABSTRACT

Systems and methods are provided for reducing error in data compression and decompression when data is transmitted over low bandwidth communication links, such as satellite links. Embodiments of the present disclosure provide systems and methods for variable block size compression for gridded data, efficiently storing null values in gridded data, and eliminating growth of error in compressed time series data.

22 Claims, 14 Drawing Sheets

FIG. 5

DCT Values (502)

| -415 | -33 | -58 | 35 | 58 | -51 | -15 | -12 |
|---|---|---|---|---|---|---|---|
| 5 | -34 | 49 | 18 | 27 | 1 | -5 | 3 |
| -46 | 14 | 80 | -35 | -30 | 19 | 7 | -18 |
| -53 | 21 | 34 | -20 | 2 | 34 | 36 | 12 |
| 9 | -2 | 9 | -5 | -32 | -15 | 45 | 37 |
| -8 | 15 | -16 | 7 | -8 | 11 | -4 | 7 |
| 19 | -28 | -2 | -26 | -2 | 7 | -44 | -21 |
| 18 | 25 | -12 | -44 | 35 | 48 | -37 | -3 |

Quantization Matrix (504)

| 16 | 11 | 12 | 14 | 18 | 24 | 49 | 72 |
|---|---|---|---|---|---|---|---|
| 12 | 12 | 13 | 17 | 22 | 35 | 64 | 92 |
| 14 | 13 | 16 | 22 | 37 | 55 | 78 | 95 |
| 14 | 17 | 22 | 29 | 51 | 64 | 87 | 98 |
| 18 | 22 | 37 | 56 | 68 | 81 | 103 | 112 |
| 24 | 35 | 55 | 64 | 81 | 104 | 113 | 120 |
| 49 | 64 | 78 | 87 | 103 | 121 | 120 | 103 |
| 72 | 92 | 95 | 98 | 112 | 100 | 103 | 99 |

Zeroed Matrix (506)

| -26 | -3 | -6 | 2 | 2 | -1 | 0 | 0 |
|---|---|---|---|---|---|---|---|
| 0 | -3 | 4 | -1 | -1 | 0 | 0 | 0 |
| -3 | 1 | 5 | -1 | -1 | 0 | 0 | 0 |
| -4 | 1 | 2 | -1 | 0 | 0 | 0 | 0 |
| 1 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

| T0 | | | |
|---|---|---|---|
| 27 | 25 | 24 | 25 |
| 29 | 28 | 26 | 27 |
| 30 | 29 | 28 | 28 |
| 31 | 31 | 31 | 30 |

1102

| T1 | | | |
|---|---|---|---|
| 28 | 26 | 24.5 | 25.5 |
| 30 | 28.5 | 26.5 | 27.5 |
| 31 | 30 | 29 | 29 |
| 32 | 32 | 32 | 31 |

1104

| T1P = T1 − T0 | | | |
|---|---|---|---|
| 1 | 1 | 0.5 | 0.5 |
| 1 | 0.5 | 0.5 | 0.5 |
| 1 | 1 | 1 | 1 |
| 1 | 1 | 1 | 1 |

REDUCING ERROR IN DATA COMPRESSION

CROSS REFERENCE TO RELATED APPLICATIONS

This application is a continuation application of U.S. patent application Ser. No. 17/039,720, filed on Sep. 30, 2020, which is a divisional application of U.S. patent application Ser. No. 16/378,766, filed on Apr. 9, 2019 (now U.S. Pat. No. 11,025,273), which claims the benefit of U.S. Provisional Patent Application No. 62/654,741, filed on Apr. 9, 2018, all of which are incorporated by reference herein in their entireties.

FIELD OF THE DISCLOSURE

This disclosure relates to data compression techniques, including reducing error in data compression techniques.

BACKGROUND

Many data sets include large amounts of data that is compressed before it is processed to make computation easier. Further, some data sets are transmitted over low bandwidth links, such as satellites, that require data compression for transmission. Systems and methods are needed to compress large data sets in an efficient way while minimizing error in data compression and/or decompression.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings:

FIG. 5 shows matrices illustrating an exemplary quantization step in accordance with an embodiment of the present disclosure;

FIG. 11A shows diagrams illustrating the creation of an exemplary time series difference grid in accordance with an embodiment of the present disclosure;

Figure 1:
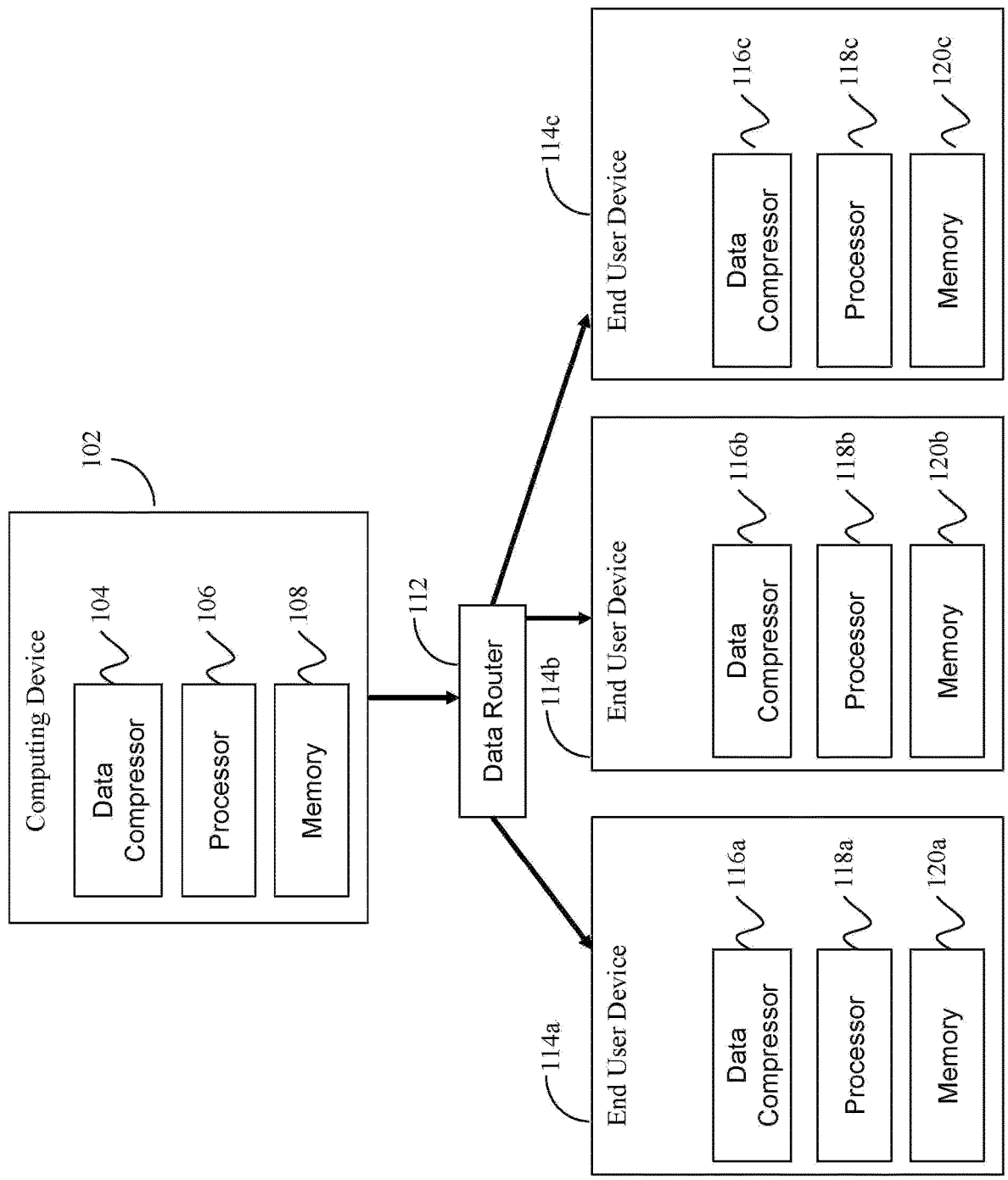
FIG. 1 is a diagram of an exemplary system that compresses and decompresses data in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to understand that such description(s) can affect such feature, structure, or characteristic in connection with other embodiments whether or not explicitly described.

1. Overview

Embodiments of the present disclosure provide systems and methods for reducing error in data compression and decompression when data is transmitted over low bandwidth communication links, such as satellite links. Embodiments of the present disclosure provide systems and methods for variable block size compression for gridded data by subdividing blocks if error for a decompressed block is above a predetermined threshold. Further, embodiments of the present disclosure provide systems and methods for efficiently storing null values in gridded data. Embodiments of the present disclosure also provide systems and methods for allowing time based series of gridded scientific data to be compressed more efficiently.

2. Data Compression and Decompression for Low Bandwidth Communication

FIG. 1 is a diagram of an exemplary system that compresses and decompresses data in accordance with an embodiment of the present disclosure. FIG. 1 includes a computing device 102 that communicates with three end user devices 114 via a data router 112. In FIG. 1, computing device 102 includes a data compressor 104, processor 106, and memory 108, and end user devices 114 include respective data compressors 116, processors 118, and memories 120.

The communication links between computing device 102 and data router 112 and between data router 112 and each of end user devices 114 can be wired or wireless communication links and long range or short range communication links in accordance with embodiments of the present disclosure. In an embodiment, the communication link between computing device 102 and data router 112 and between data router 112 and each of end user devices 114 can be low bandwidth communication links. For example, in an embodiment, data router 112 is a satellite and has low bandwidth upload and download communication links to and from computing device 102 and end user devices 114.

In an embodiment, computing device 102 is configured to compress data (e.g., using data compressor 104) prior to sending data to data router 112 (e.g., due to the low bandwidth link between computing device 102 and data router 112). In an embodiment, the data sent from computing device 102 can include destination information instructing data router 112 where to route the information (e.g., specifying sufficient routing information for data router 112 to route the information to one of end user devices 114). In an embodiment, data router 112 is configured to send data (e.g., based on the routing information) to a specified end user device (e.g., end user device 114a). In an embodiment, the receiving end user device (e.g., end user device 114a) is configured to decompress the received data (e.g., using data compressor 116a) so that the decompressed data can be more easily processed.

Data compressor 104 of computing device 104 and data compressors 116 of end user devices 114 can be configured to perform data compression, data decompression, or data compression and data decompression in accordance with embodiments of the present disclosure. For example, in an embodiment, end user device 114b can use data compressor 116b to compress data and send it to computing device 102 (via data router 112). In an embodiment, computing device 102 can decompress the received data (e.g., using data compressor 104).

Figure 2:
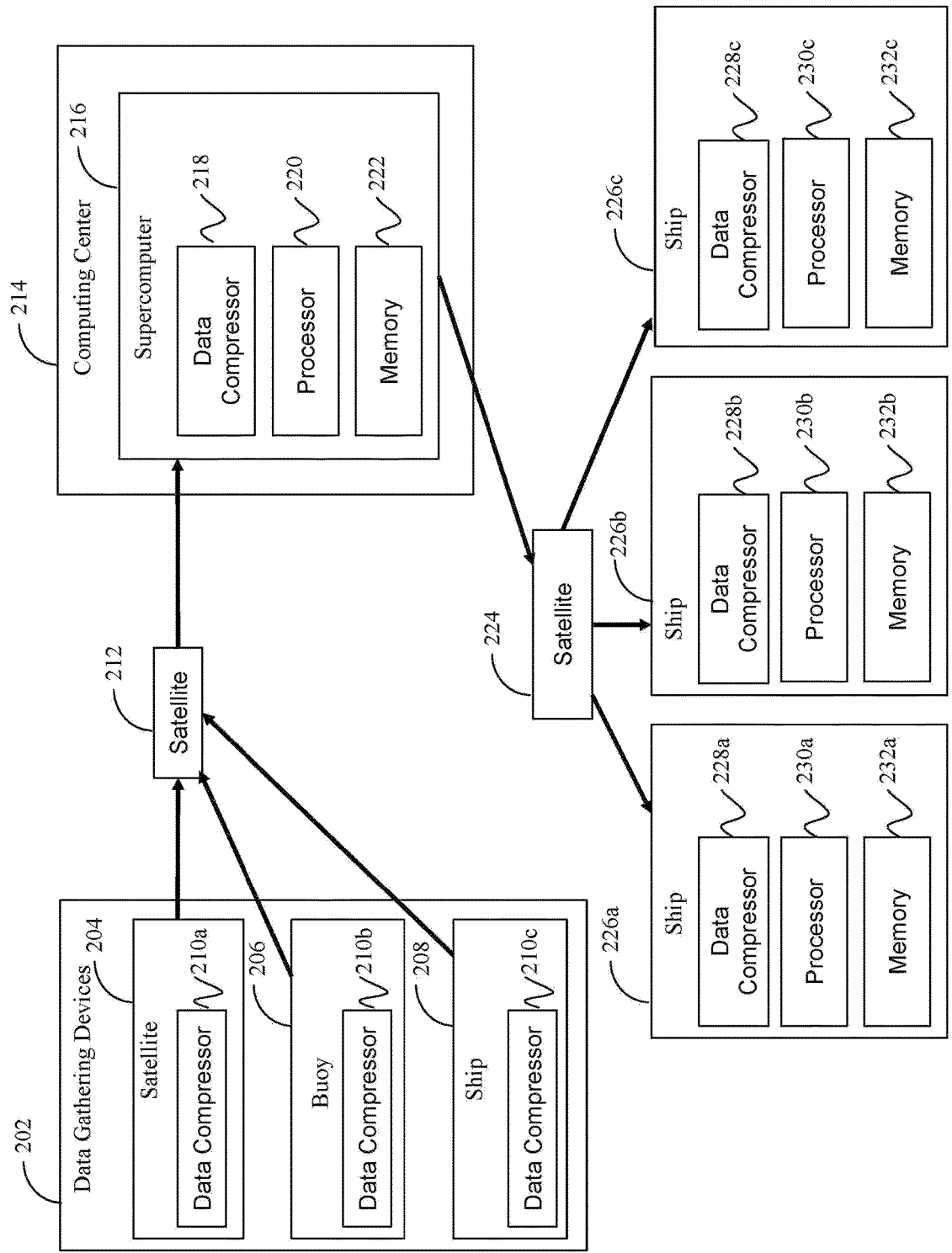
FIG. 2 is a diagram of another exemplary system that compresses and decompresses data in accordance with an embodiment of the present disclosure.

FIG. 2 is a diagram of another exemplary system that compresses and decompresses data in accordance with an embodiment of the present disclosure. In FIG. 2, data gathering devices 202 gather data (e.g., climatological data) and send the gathered data, via a satellite 212, to a computing center 214 to be processed (e.g., by a supercomputer 216 that includes a data compressor 218, a processor 220, and a memory 222). Data gathering devices 202 can include a variety of devices, including, but not limited to, satellites(s) 204 (e.g., sensing climatological data from space), buoy(s) 206 (e.g., measuring currents and/or temperatures of water), and ship(s) 208 (e.g., via onboard sensors for measuring currents and/or temperatures of water).

In an embodiment, one or more of data gathering devices 202 (e.g., satellite(s) 204, buoy(s) 206, and/or ship(s) 208) include data compressors 210. In an embodiment, data gathering devices 202 do not include data compressors 210. In an embodiment, the communication link between data gathering devices 202 and satellite 212 and/or the communication link between satellite 212 and computing center 214 are low bandwidth communication links, and data from one or more of data gathering devices 202 is compressed (e.g., using data compressors 210) before it is transmitted to satellite 212. In an embodiment, data gathering devices 202 transmit uncompressed data to satellite 212. Data transmitted from data gathering devices 202 can include destination information instructing satellite 212 where to transmit data (e.g., identifying location information for computing center 214 and/or supercomputer 216).

In an embodiment, supercomputer 216 of computing center 214 receives the data from satellite 212 and processes the data. In an embodiment, supercomputer 216 gathers and processes a large amount of data that cannot be easily transmitted to end user devices (e.g., ships 226) and compresses the data for easier transmission (e.g., using data compressor 218). For example, in an embodiment, supercomputer 216 gathers climatological data from a variety of sources (e.g., from satellite(s) 204, buoy(s) 206, and/or ship(s) 208) and generates a forecast. In an embodiment, supercomputer 216 compresses the forecast data, using data compressor 218, and sends it to one or more of ships 226 via satellite 224. In an embodiment, the communication link between computing center 214 and satellite 224 and the communication link between satellite 224 and ships 226 are low bandwidth communication links. In an embodiment, each of ships 226 includes a data compressor 228, a processor 230, and a memory 232.

Data compressors 104, 116, 210, 218, and 228 can be implemented using hardware, software, and/or a combination of hardware and software in accordance with embodiments of the present disclosure. Further, data compressors 104, 116, 210, 218, and 228 can be implemented using a single device (e.g., a single chip) or multiple devices. Data compressors 104, 116, 210, 218, and 228 can be integrated into a host device (e.g., integrated into computing device 102, end user device 114, satellite 204, buoy 206, ship 208, supercomputer 216, and/or ships 226).

In an embodiment, data compressors 104, 116, 210, 218, and 228 can be implemented as standalone (e.g., special purpose) devices. In an embodiment, data compressors 104, 116, 210, 218, and 228 can include one or more processors and/or memories. In an embodiment, computing device 102 can be a data compressor device, and data compressor 104 can be hardware or software (stored within memory 108 or outside of memory 108) for performing data compression and/or decompression functions. In an embodiment data router 112, satellite 212, and/or satellite 224 can also include data compressors, such as data compressors 104, 116, 210, 218, and 228.

In an embodiment, data compressors 228 can be configured to compress, decompress, or compress and decompress data. For example, in an embodiment, supercomputer 216 transmits compressed forecast data to ship 226a to satellite 224 and includes destination information for ship 226a. In an embodiment, satellite 224 relays the data to ship 226a, and ship 226a decompresses the compressed forecast data using data compressor 228a so that the decompressed forecast data can be used by ship 226a.

While data compressors in accordance with embodiments of the present disclosure have been described above with reference to embodiments with computing devices (e.g., computing device 102) and end user devices (e.g., end user devices 114) supercomputers (e.g., supercomputer 216), and ships (e.g., ships 226), it should be understood that data compressors in accordance with embodiments of the present disclosure can be used in a wide variety of systems, methods, and devices.

Embodiments of the present disclosure provide systems and methods to enable data compressors 104, 116, 210, 218, and 228 to compress and/or decompress data more effectively (e.g., more efficiently and with fewer errors due to data compression and/or decompression). For example, embodiments of the present disclosure provide systems and methods to enable data compressors 104, 116, 210, 218, and 228 to use variable block size compression for gridded data by subdividing blocks if error for a decompressed block is above a predetermined threshold. Further, embodiments of the present disclosure provide systems and methods to enable data compressors 104, 116, 210, 218, and 228 to efficiently store null values in gridded data. Embodiments of the present disclosure also provide systems and methods to enable data compressors 104, 116, 210, 218, and 228 to allow time based series of gridded scientific data to be compressed more efficiently. These systems and methods to enable data compressors 104, 116, 210, 218, and 228 to compress and/or decompress data more effectively will now be discussed in more detail.

3. Variable Block Size Compression for Gridded Data

Figure 3:
FIG. 3 is an exemplary diagram representing surface temperature of the Pacific Ocean off the west coast of North America in accordance with an embodiment of the present disclosure.

Embodiments of the present disclosure provide systems and methods for allowing data (e.g., gridded data from scientific observations) to be compressed using a variable block size technique. FIG. 3 is an exemplary diagram representing surface temperature of the Pacific Ocean off the west coast of North America in accordance with an embodiment of the present disclosure. The white areas in FIG. 3 represent land (the west coast of the North American continent), and the shaded colors represent water temperature values. In an embodiment, water temperature data from FIG. 3 can be stored (e.g., using a grid having rows and columns of data). In an embodiment, all grid values are stored as 32 bit floating point values. Because the data set of ocean water temperatures can be very large, the data can be compressed for easier transmission and/or processing.

In an embodiment, compression algorithms use a grid oriented approach. For example, instead of processing an entire grid of data at once, grid-oriented algorithms can compress smaller blocks of data in the grid (e.g., block sizes of 8×8, 16×16, 32×32, 64×64, etc.). In an embodiment, grids and/or blocks of data can be represented as matrices and can be processed using Discrete Cosine Transform (DCT) or similar techniques for data compression purposes. Larger block sizes can require more computational effort but can allow for more compression.

3.1. Matrix Compression

Figure 4:
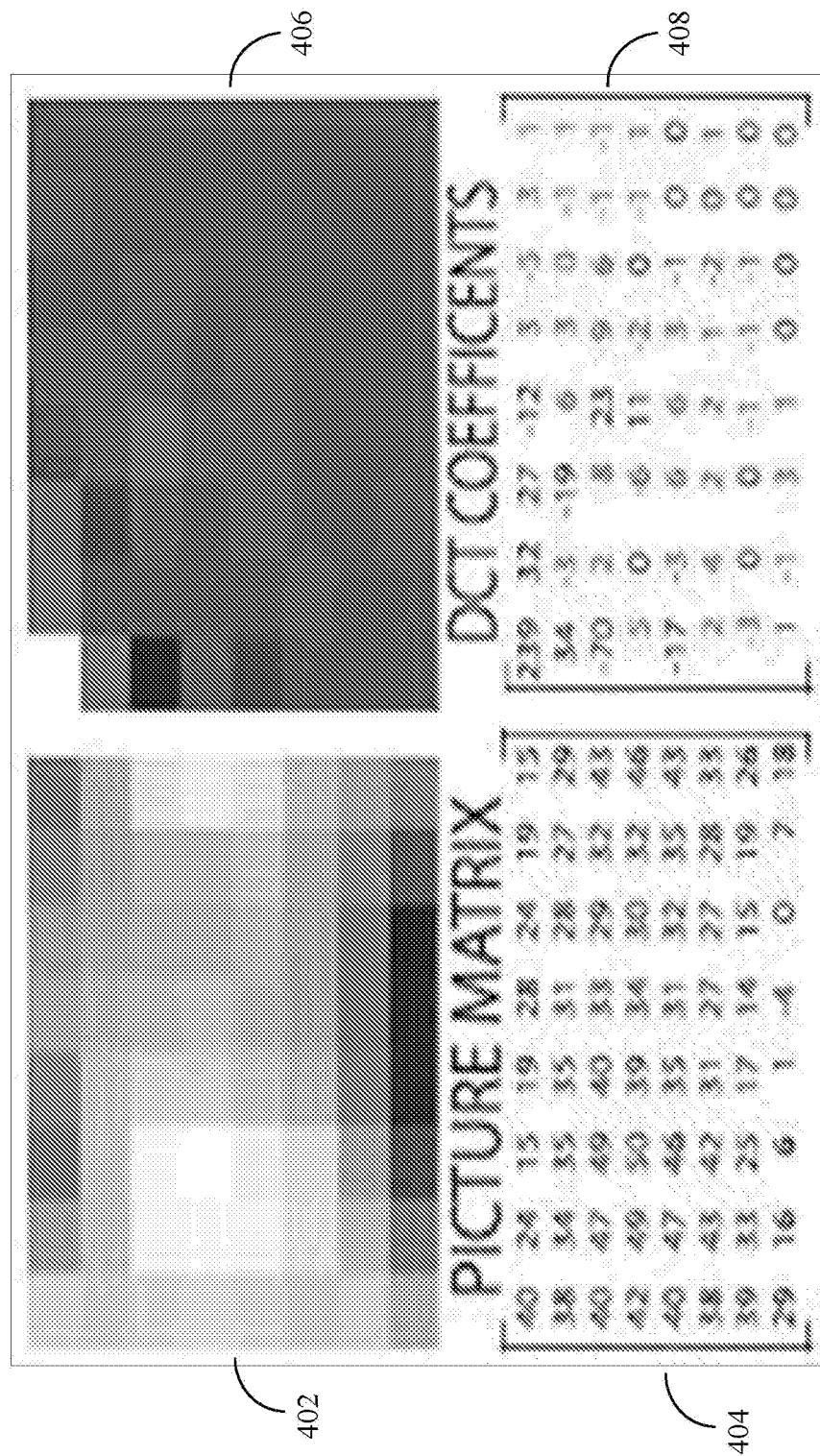
FIG. 4 shows results of a Discrete Cosine Transform (DCT) in accordance with an embodiment of the present disclosure.

FIG. 4 shows results of a Discrete Cosine Transform (DCT) in accordance with an embodiment of the present disclosure. The picture matrix 404 represents the original data 402. The DCT matrix 408 represents DCT data 406 after the DCT has been applied to the original data 402. In an embodiment, DCT matrix 408 can be highly compressed. As shown in FIG. 4, much of the data in DCT matrix 408 is packed into the upper left corner of DCT matrix 408. In an embodiment, to compress data in DCT matrix 408, after creation of DCT matrix 408, a quantization matrix (also called a threshold matrix) is applied that reduces many of the small values in DCT matrix 408 to zero.

FIG. 5 shows matrices illustrating an exemplary quantization step in accordance with an embodiment of the present disclosure. In FIG. 5, a quantization matrix 504 is applied to a DCT matrix 502 (e.g., containing DCT coefficients). For example, in an embodiment, DCT matrix 502 is divided (e.g., element by element) by quantization matrix 504, and, after the results are rounded to integers, zeroed matrix 506 is produced. As shown in FIG. 5, zeroed matrix 506 is mostly zeroes and is therefore highly compressed. In an embodiment, DCT matrix 502 is fully invertible, but zeroed matrix 506 is not invertible. Thus, compressing DCT matrix 502 into zeroed matrix 506 can make DCT matrix 502 easier to work with but can also be a lossy process. In an embodiment, smaller block sizes require less computation for the DCT step, but they typically provide lower compression. In practice, compression algorithms try to pick a block size that balances the computational time needed, the compression desired, and the tolerated loss.

3.2. Variable Block Size Compression

Embodiments of the present disclosure provide systems and methods that enable the block size of a compression algorithm to be dynamically changed. In an embodiment, dynamically changing the block size of a compression algorithm enables compression of data to be optimized while maintaining a tolerable amount of loss.

Figure 6:
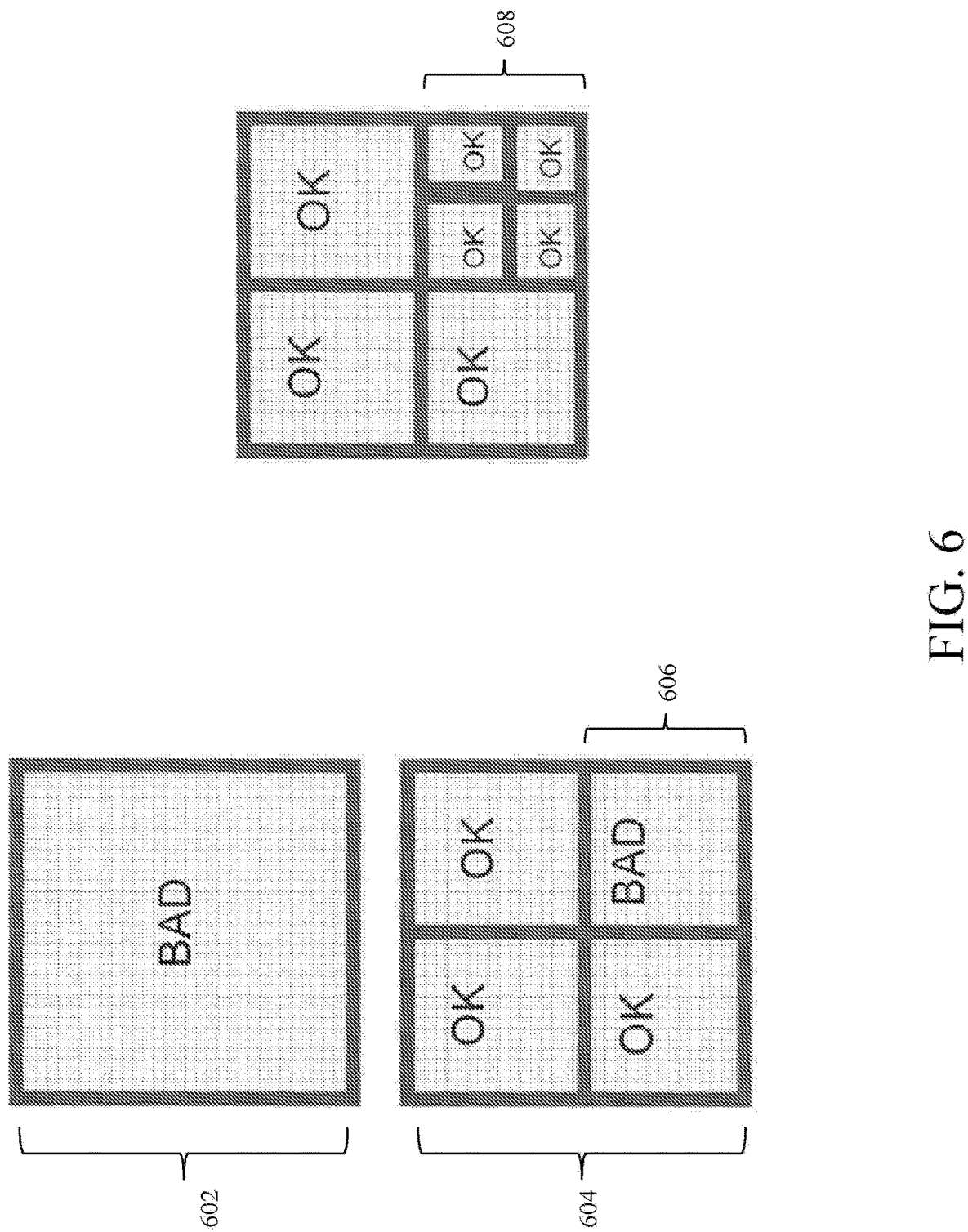
FIG. 6 shows diagrams illustrating an exemplary variable compression method in accordance with an embodiment of the present disclosure.

FIG. 6 shows diagrams illustrating an exemplary variable compression method in accordance with an embodiment of the present disclosure. In an embodiment, the exemplary variable compression method starts with an original block 602 of input data to be compressed (e.g., a 32×32 matrix). In an embodiment, the entire grid of data can be used as original block 602. In an embodiment, if the grid of input data is especially large, the grid of input data can first be subdivided into a maximum block size (e.g., based on a predetermined maximum block size threshold, such as a 32×32 block) before the blocks are compressed. In an embodiment, each block is compressed (e.g., using a transform and quantization technique as described above with reference to FIG. 5). For example, in FIG. 6, original block 602 is compressed.

In an embodiment, the compressed blocks are then decompressed and compared to the original data. The decompressed version will likely be somewhat different from the original data. In an embodiment, if the differences between the decompressed block and the original data are greater than a predetermined threshold, then the larger original block is sub-divided into sub-blocks 604 (e.g., into 4 equally sized sub-blocks). In an embodiment, the number of sub-blocks to create is based on a predetermined threshold (e.g., 4 sub-blocks). In FIG. 6, the 32×32 original block 602 is divided into 4 16×16 sub-blocks 604. Each of sub-blocks 604 can then be compressed, and the process can be repeated. For example, in FIG. 6, sub-block 606 was shown to be outside of the error tolerance range and was subdivided into sub-blocks 608, which were all shown to be within the error tolerance range.

In an embodiment, the process is recursive, and as long as a block's compressed version is outside of the error tolerance, the block can continue to be sub-divided. In an embodiment, blocks outside of the error tolerance range can continue to be subdivided down to a block size of 1×1. In an embodiment, in the case of a 1×1 block, the DCT result is the same as the original data, and the threshold comparison will show almost no loss.

Figure 7:
FIG. 7 is an image of an area of ocean temperature data in accordance with an embodiment of the present disclosure.

FIG. 7 is an image of an area of ocean temperature data in accordance with an embodiment of the present disclosure. In FIG. 7, the top left part of the image is a warmer region than the bottom right. Grouping all these grid cells into the same compression block will cause both regions to be shifted towards each other's temperatures. Using a dynamic compression method in accordance with an embodiment of the present disclosure allows the different regions of the image of FIG. 7 to be compressed separately and more accurately.

3.3. Exemplary Systems and Methods Using Variable Block Size Compression

Figure 8:
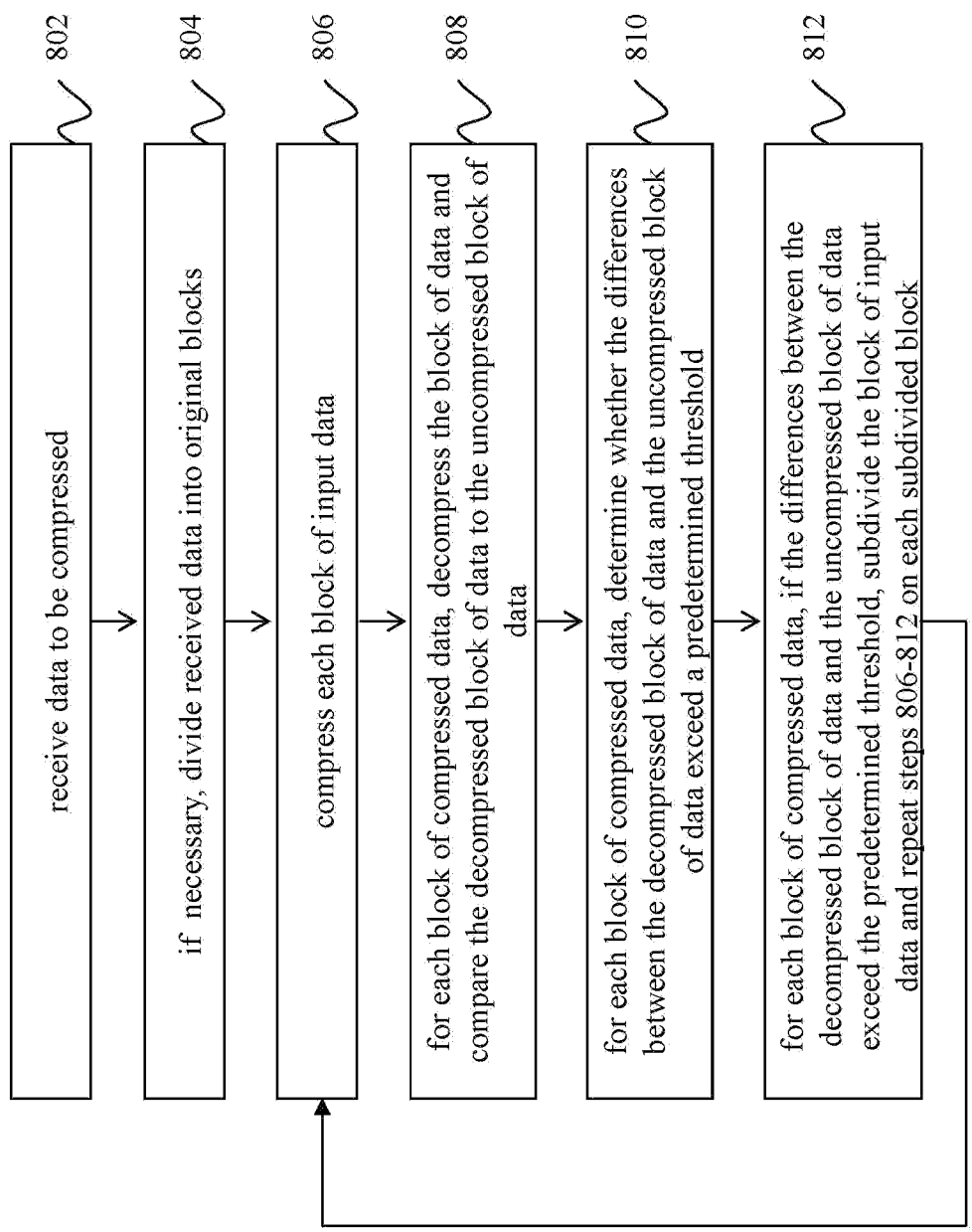
FIG. 8 is a flowchart of an exemplary method for variable block size compression in accordance with an embodiment of the present disclosure.

FIG. 8 is a flowchart of an exemplary method for variable block size compression in accordance with an embodiment of the present disclosure. In step 802, data to be compressed is received. For example, in an embodiment, a grid of data of surface ocean temperature (e.g., as shown in FIG. 3) is received. For example, in an embodiment, satellite 204 collects the ocean surface temperature data and transmits the data to computing center 214, where it is received by supercomputer 216.

In step 804, the received data is divided into original blocks, if necessary. For example, in an embodiment, supercomputer 216 (e.g., using processor 220 and/or data compressor 218) determines whether to subdivide the received data into blocks of a predetermined maximum block size before further processing. In step 806, each block of the received data is compressed (e.g., using compressor 218). For example, in an embodiment, supercomputer 216 (e.g., using processor 220 and/or data compressor 218) can perform a DCT on each block of original data to compress the data, thereby generating DCT matrices for each block of original data. In an embodiment, a quantization matrix can be applied to each DCT matrix, and the resulting values in the matrices can be rounded to integers, thereby generating a plurality of zeroed matrices as compressed data.

Steps 808, 810, and 812 are then performed on each block of compressed data. In step 808, a block of compressed data is decompressed (e.g., using compressor 218 and/or processor 220) and compared to the uncompressed block of data. In step 810, a determination is made (e.g., using compressor 218 and/or processor 220) regarding whether the differences between the decompressed block of data and the uncompressed block of data exceed a predetermined threshold (e.g., a predetermined error tolerance threshold). In step 812, if the differences between the decompressed block of data and the uncompressed block of data exceed the predetermined threshold, the block of input data is subdivided (e.g., using compressor 218 and/or processor 220).

For example, in an embodiment, if the differences between the decompressed block of data and the uncompressed block of data exceed the predetermined threshold, a determination can be made (e.g., using compressor 218 and/or processor 220) that a compression error has occurred for the block of data. In an embodiment, if the differences between the decompressed block of data and the uncompressed block of data do not exceed the predetermined threshold, a determination can be made (e.g., using compressor 218 and/or processor 220) that no compression error has occurred for the block of data.

In an embodiment, steps 808, 810, and 812 are performed on each block of compressed data until each block of compressed data has been determined to either not exceed the predetermined error tolerance threshold or has been further subdivided in response to a determination that the data compression for the block has resulted in the error tolerance threshold has been exceeded. Steps 808, 810, and 812 can be performed in series or in parallel in accordance with embodiments of the present disclosure. For example, in an embodiment, each block of compressed data can be checked against the error tolerance threshold (e.g., using steps 808, 810, and 812) in turn, or all blocks of data can be checked against the error tolerance threshold at the same time.

In FIG. 8, the method then returns to step 806 and is repeated on each block of newly subdivided data. For example, in an embodiment, if a block of data was determined to exceed the error tolerance threshold in step 810, the block of data is subdivided in step 812 (e.g., into 4 new blocks). In step 806, these 4 new blocks can be compressed, and each of these 4 new blocks can be checked against the error tolerance threshold using steps 808, 810, and 812. In an embodiment, if multiple blocks of data were determined to exceed the error tolerance threshold in step 810, each block of data that exceeded the error tolerance threshold is subdivided in step 812 (e.g., into 4 new blocks). In step 806, each set of subdivided blocks can be compressed, and each of these new subdivide sets of blocks can be checked against the error tolerance threshold using steps 808, 810, and 812. Operations on each set of newly subdivided blocks that exceeded the error tolerance threshold can be performed in series or in parallel in accordance with embodiments of the present disclosure.

3.4. Exemplary Advantages and Alternatives of Using Variable Block Size Compression Embodiments of the present disclosure using variable block size compression data grids that exhibit high variability to be easily and efficiently compressed. Embodiments of the present disclosure using variable block size compression enable a compression method to be tuned to an exact error tolerance. This is a key requirement for scientific data. For example, a temperature grid can be compressed with error less than 0.01 degrees. This enables optimal compression controlled for tolerated loss.

Embodiments of the present disclosure using variable block size compression use the real error of the compression step and thus definitively control the error. In an embodiment, storing markers that indicate when a block has been subdivided can be used. For example, in an embodiment, 16 bit (short) numbers are used to store data values. In an embodiment, the last value in this range can be reserved to indicate that a block has been subdivided. This results in negligible loss of precision and doesn't require addition of a header or marker byte to the data sequence.

4. Efficiently Storing Null Values in Gridded Data

As described above, FIG. 3 is an exemplary diagram representing surface temperature of the Pacific Ocean off the west coast of North America. In FIG. 3, the white areas representing land can be considered null areas because they are not relevant for ocean temperature values. Embodiments of the present disclosure provide systems and methods for efficiently storing null values to improve data compression.

4.1. Storing Null Values Using Sentinel Values

One method for representing null areas in a data grid is to represent data at these null areas with a marker or sentinel value that indicates the lack of data (e.g., ocean temperature data) in the data grid cell for these locations. Typical marker values can be selected such that they are not likely to be misinterpreted as real data. Examples would include −999999, 99999, 888888, or similar values.

While using sentinel values makes it simple to store and interpret grids with null area values, using sentinel values can cause problems for data compression algorithms. Compression algorithms reduce the amount of storage space needed for the data. Lossless compression reduces bits by identifying and eliminating statistical redundancy. No information is lost in lossless compression. Lossy compression reduces bits by removing unnecessary or less important information.

Because sentinel values are specifically selected to be very different from the real data values, they can introduce a very high discontinuity in regions where data values and null values touch each other. This discontinuity can cause problems with data compression algorithms, specifically those using signal processing techniques like Discrete Cosine Transform (DCT). DCT based techniques work well for data sets that have subregions with very high grid cell similarity.

4.2. Efficiently Storing Null Values in Gridded Data

Figure 9:
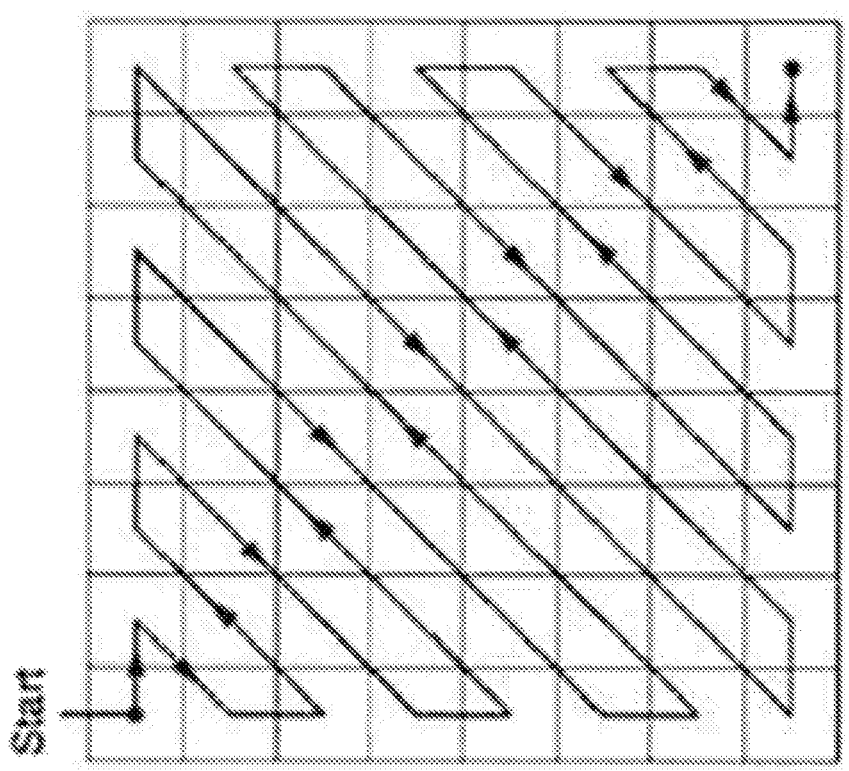
FIG. 9 is a diagram illustrating how a 2 dimensional (2D) grid of data can be zig-zag encoded to create a linear signal in accordance with an embodiment of the present disclosure.

Embodiments of the present disclosure provide systems and methods that efficiently store null values in gridded data while avoiding the negative effects on data compression that using sentinel values causes. In an embodiment, null values are stored in a separate data structure from the data structure used to store the gridded data. For example, in an embodiment, null values are represented using a simple binary grid which only contains 0 or 1 values (e.g., 0 for null and 1 for real data). In an embodiment, the grid can then be encoded (e.g., zig-zag encoded) to make it usable as a linear signal. Then, in an embodiment, the linear signal of 0's and 1's is run length encoded (RLE). FIG. 9 is a diagram illustrating how a 2 dimensional (2D) grid of data can be zig-zag encoded to create a linear signal in accordance with an embodiment of the present disclosure.

In an embodiment, gridded data can be represented by collections of many 2D grids. In a numerical ocean model example, there might be model grids for 100 different water depths and over 40 different time steps, resulting in 4000 separate 2D grids. Locations of null values will often be very similar between proximate 2D grids (e.g., up to 98% to 99% of the null values can be the same between proximate 2D grids).

In an embodiment comprising multiple 2D grids for a data set, only null values for the first 2D grid are stored in a RLE sequence, and null values from subsequent grids are separately stored (e.g., as (x, y) points). In an embodiment, only (x, y) indexes of grid cells with a change in null value from the previous grid are stored. This generates a sequence of (x, y) index values. The RLE base grid and the sequence of different indexes can then be compressed (e.g., using a standard lossless compression algorithm such as ZIP, BZIP or deflate). A typical compression ratio is greater than 100 to 1.

Embodiments of the present disclosure can also replace the null marker values in the original grid. Several options can be used to replace null markers that will minimally disrupt transform based compression. For example, these options can include the local mean or median, the global mean or median, dilated mean or median fill, and/or bi-linear or bi-cubic interpolated fill. For example, in a fill operation, a 3×3, 4×4, 8×8, or 16×16 window can be moved over the grid, and null values can be replaced with the mean or median from that moving window.

In an embodiment, specific attributes of the data and performance requirements dictate which replacement technique to use (e.g., a replacement technique with the best compression to loss performance can be selected). In an embodiment, the data grid can be decompressed using an appropriate technique, and then the decompressed null map can be used to put the null values back into the data grid. In an embodiment, some compression blocks are all null and can be skipped altogether and reconstructed from the null mask during decompression.

Figure 10:
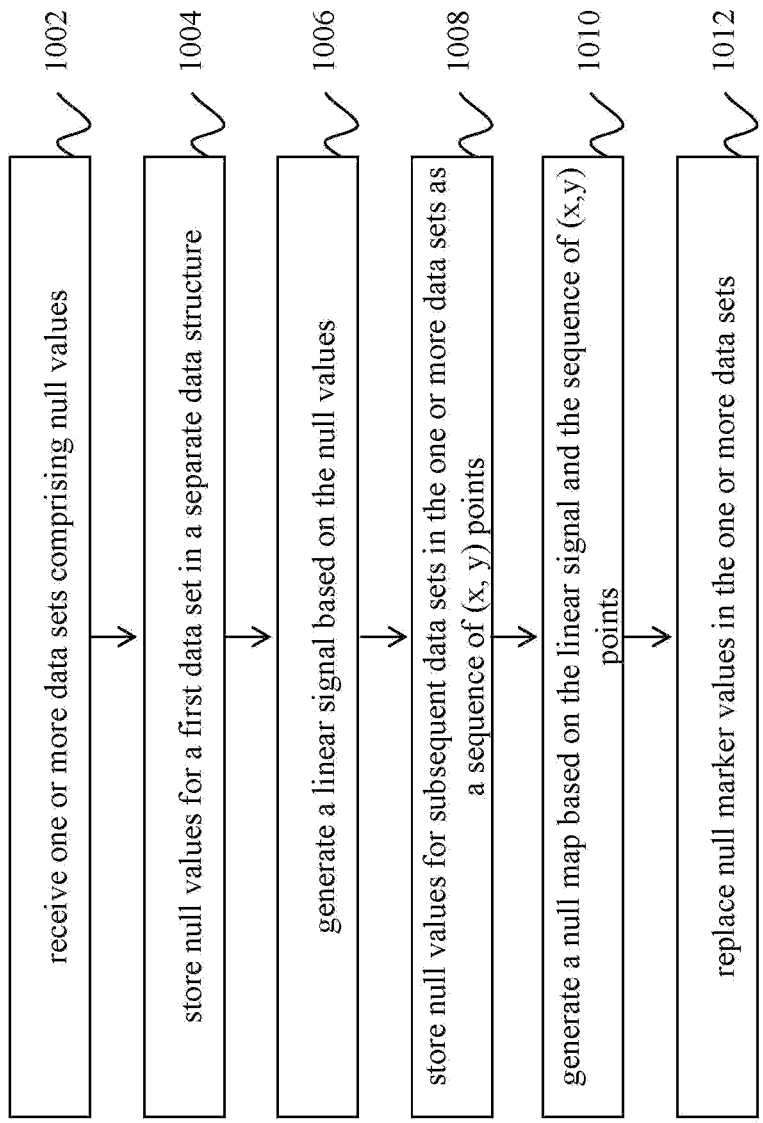
FIG. 10 is a flowchart of an exemplary method for efficiently storing null value in gridded data in accordance with an embodiment of the present disclosure.

4.3. Exemplary Systems and Methods for Efficiently Storing Null Values in Gridded Data FIG. 10 is a flowchart of an exemplary method for efficiently storing null value in gridded data in accordance with an embodiment of the present disclosure. In step 1002, one or more data sets comprising null values are received (e.g., by computing device 102). In step 1004, null values for a first data set are stored in a separate data structure. For example, in an embodiment, computing device 102 (e.g., using data compressor 104 and/or processor 106) can store null values for a first data set in the received data sets in a separate data structure, such as a binary grid. In an embodiment, the binary grid can be stored (e.g., in memory 108).

In step 1006, a linear signal is generated based on the null values. For example, in an embodiment, computing device 102 (e.g., using data compressor 104 and/or processor 106) encodes the binary grid (e.g., using zig-zag encoding) into a linear signal. In an embodiment, the linear signal can then be run length encoded. In step 1008, null values for subsequent data sets in the one or more data sets are stored as a sequence of (x, y) points. For example, in an embodiment, if the received data sets include a plurality of data sets, only null values for the first data set can be stored as a separate data structure, and null values for additional data sets can be stored using a sequence of (x, y) points. For example, computing device 102 (e.g., using data compressor 104 and/or processor 106) can store (e.g., in memory 108) null values for each additional data set as a (x, y) index values in a sequence of (x, y) points.

In step 1010, a null map is generated (e.g., using data compressor 104 and/or processor 106) based on the linear signal and (if multiple data sets are present) the sequence of (x, y) points. In an embodiment, the linear signal and the sequence of (x, y) points are compressed to form the null map. For example, in an embodiment, computing device 102 (e.g., using data compressor 104 and/or processor 106) can compress the linear signal and the sequence of (x, y) points. In an embodiment, the null map is formed using the uncompressed linear signal and (if multiple data sets are present) the sequence of (x, y) points.

In step 1012, null marker values in the one or more data sets are replaced. For example, in an embodiment, computing device 102 (e.g., using data compressor 104 and/or processor 106) can replace the null marker values in the original received one or more data sets (e.g., using a fill operation with a moving window that replaces null values with a mean or median from values within the moving window).

Once the null values have been replaced using the method of FIG. 10, data in the original data sets can be more easily compressed (e.g., by compressor 104) and transmitted (e.g., over a low bandwidth communication link). In an embodiment, when the compressed original one or more data sets are transmitted, the null map can also be transmitted (e.g., to an end user such as end user device 114a). In an embodiment, when the compressed original one or more data sets are received, they can be decompressed using the null map. For example, in an embodiment, end user device 114a can use the null map to decompress the original one or more data sets (e.g., using data compressor 116a). In an embodiment, the decompressed null map can be used to put the null values back into the decompressed original one or more data sets at locations indicated by the null map.

4.4. Exemplary Advantages of Efficiently Storing Null Values in Gridded Data

Embodiments of the present disclosure for efficiently storing null values in gridded data have several advantages. For example, embodiments of the present disclosure allow for null values to be compressed losslessly, while the actual data grids are compressed in a lossy manner. This is important because scientific data grids made up of floating point values can be stored lossy with little or no impact on use or interpretation of the data.

Embodiments of the present disclosure can be used to improve the performance of all grid compression algorithms. Using null marker values makes compression less efficient mostly due to signal processing problems caused by discontinuities in the source data.

Embodiments of the present disclosure can be used to improve block oriented compression techniques. As the grid data is divided into blocks for compression, the null map can be queried and all null blocks can simply be skipped altogether. On decompression, the null map can be referenced and used to reconstruct the skipped blocks.

5. Eliminating Growth of Error in Compressed Time Series Data

Data sets of climatological measurements, such as data sets for numerical ocean models, are typically generated based on data gathered over multiple time steps from the same geographic area. For example, data sets for weather forecasting can typically include data gathered every 1 to 3 hours over a 3 to 7 day period. Climatological data sets might include time steps over a many year period. Such data sets can include large amounts of data that can be difficult to work with unless compressed. This presents an opportunity for improved compression performance. Compression algorithms take advantage of statistical similarities between segments of a data series to store the data series using fewer bytes. Time sequenced areas of numerical environmental models are highly correlated. The temperature of the ocean at time zero is a very good prediction of the temperature at time zero plus one hour. Embodiments of the present disclosure provide systems and methods for allowing time based series of gridded scientific data to be compressed more efficiently.

5.1. Time Series Compression

FIG. 11A shows diagrams illustrating the creation of an exemplary time series difference grid in accordance with an embodiment of the present disclosure. FIG. 11A shows a first 4×4 grid of data 1102 at a first time step T0 and a second 4×4 grid of data 1104 at a the next time step T1. A third 4×4 grid of data 1106 shows the differences between each element in grids 1102 and 1104 (i.e., T1P=T1−T0).

In FIG. 11A, the difference grid 1106 for T1P is much more compressible than grid 1104 for T1. With lossy compression and time differencing, signal drifting can occur over time. For example, if there is 0.1 degrees of average loss at T0, this can accumulate and be ~4 degrees by T40. With ocean models, time differences are much more correlated than depth differences. Ocean models are closely spaced near the surface (e.g., 10 meters) but sparsely spaced towards the bottom (e.g., 500 meters)

5.2. Eliminating Growth of Error in Compressed Time Series Data

Embodiments of the present disclosure use the natural correlation of time sequenced model data to improve compression performance, especially for lossy compression algorithms. To address issues with signal drift, embodiments of the present disclosure use the lossy de-compressed signal at each stage to compute the time based difference (e.g., T1P=T1−T0$_{Decompressed}$). In an embodiment, the decompressed version of T0 is reproduced exactly, and this eliminates any drift over time. This step can require a large amount of computation, because each block has to be compressed and then decompressed during initial compression. However, in an embodiment this step can be performed using a supercomputer (e.g., supercomputer 216) after model generation, where resources are less of an issue. In an embodiment, decompression performance is not impacted by this step.

In an embodiment, for a sequence of gridded data sets, the first data set can be labeled as T0, and subsequent data sets can be labeled as T1, T2, . . . , TN. In an embodiment, all data sets with time greater than zero are replaced with the difference between the current data set and the immediately previous set. So, in an embodiment the original data set for T0 remains unchanged (e.g., as shown by grid 1102), but the data set for T1 is replaced by the data set for T1P (e.g., grid 1104 is replaced with grid 1106). Likewise, for example, a data set for T2 is replaced by a difference grid generated by subtracting (e.g., element by element) data in the data set at T1 from data in the data set at T2 (e.g., T2P=T2−T1). Difference grids can be generated for data sets at each time sets, up to TN. In an embodiment, these difference grids are more compact than the originals and are much more compressible.

In an embodiment, when the data is decompressed, this process can be reversed. For example, in an embodiment, the values for the data set 1102 at T0 are added to values for data set 1106 (T1P) to get the original values for the data set 1104 at T1 (e.g., with some loss accounted for in a lossy compression algorithm). This process can create a problem for lossy compression algorithms. Since each step of the compression is tied to the immediately preceding one, and each step introduces some loss, the loss can naturally accumulate as we proceed. For example, there might be 0.01 degree loss for T0, but 0.09 degree loss for T6.

In an embodiment, to address this issue, when the data set 1102 for T0 is compressed, it is immediately decompressed into another data set (e.g., T0E). In an embodiment, this data set contains the original data with some error from the lossy compression. In an embodiment, the T0E data set is what can be recovered via decompression. Then, to create the data set 1106 at T1P for storage, instead of using the original data set 1102 at T0, the data set at T0E can be used, so that the data set 1106 at T1P is now T1P=T1−T0E.

Figure 11B:
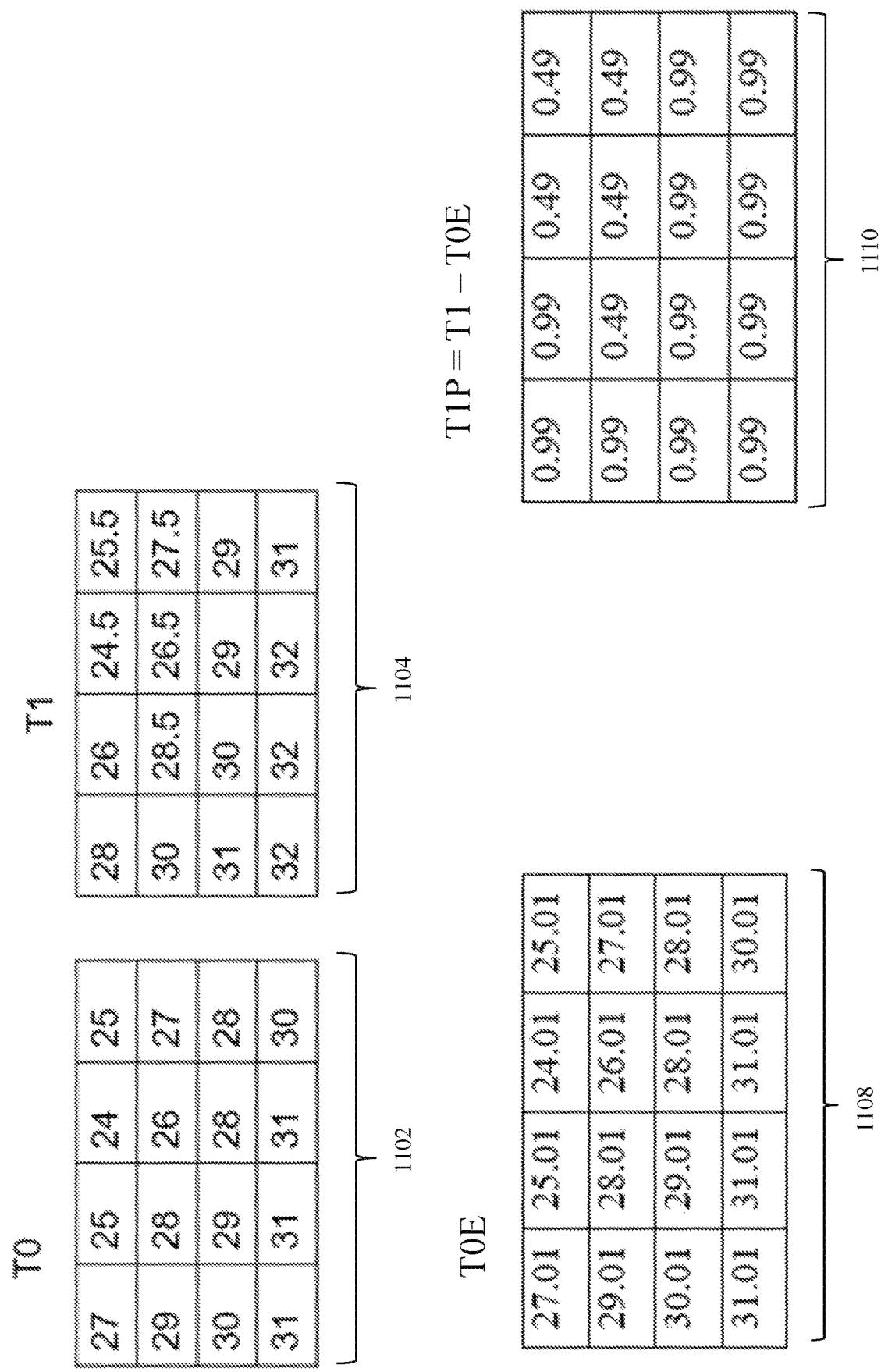
FIG. 11B shows diagrams illustrating the creation of an exemplary time series difference grid accounting for compression error in accordance with an embodiment of the present disclosure.

FIG. 11B shows diagrams illustrating the creation of an exemplary time series difference grid accounting for compression error in accordance with an embodiment of the present disclosure. In FIG. 11B, grid 1108 is created for T0E by compressing data from grid 1102 at time T0 (e.g., using a compression algorithm) and then decompressing the compressed data. As illustrated by FIG. 11B, there are some differences between grids 1102 and 1108 due to compression error. In FIG. 11B, to account for this compression error, the difference grid 1110 is calculated by subtracting (e.g., element by element) data in grid 1108 from data in grid 1104 (e.g., T1P=T1−T0E).

In an embodiment, this process can be followed for all subsequent time steps. For example, a data set for T2 can be replaced by first compressing and decompressing data set T1 to generate T1E (which can contain some compression error) and then generating a difference grid by subtracting (e.g., element by element) data in T1E from data in the data set at T2 (e.g., T2P=T2−T1E). Difference grids can be generated for data sets at each time sets, up to TN. By using this method, the compression error does not accumulate over time.

Figure 12:
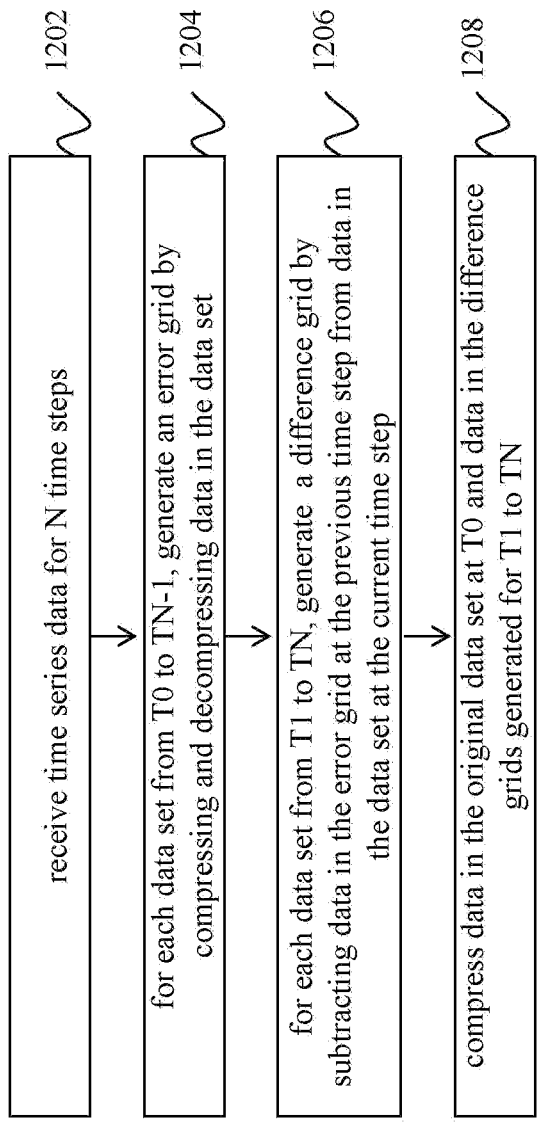
FIG. 12 is a flowchart for a method for eliminating growth of error in compressed time series data in accordance with an embodiment of the present disclosure.

5.3. Exemplary Systems and Methods for Eliminating Growth of Error in Compressed Time Series Data FIG. 12 is a flowchart for a method for eliminating growth of error in compressed time series data in accordance with an embodiment of the present disclosure. In step 1202, time series data for N time steps is received. For example, in an embodiment, computing device 102 receives time series data for N time steps. In step 1204, for each data set from T0 to TN−1, an error grid is generated by compressing and decompressing data in the data set. For example, in an embodiment, computing device 102 (e.g., using data compressor 104 and/or processor 106) compresses data in data sets for times T0, T1, . . . , TN−1 (e.g., using a compression algorithm) and then decompresses the compressed data at each time set, thereby generating error grids T0E, T1E, . . . , TN−1E.

In step 1206, for each data set from T1 to TN, a difference grid is generated by subtracting data in the error grid at the previous time step from data in the data set at the current time step. For example, in an embodiment, computing device 102 (e.g., using data compressor 104 and/or processor 106) generates difference grids for each time step by calculating T1P=T1−T0E, T2P=T2−T1 E, . . . , TNP=TN−T(N−1)E. In step 1208, data in the original data set at T0 is compressed, and data in the difference grids generated for T1 to TN is compressed. For example, in an embodiment, data compressor 104 can compress data at the original data set at T0 and data in each generated difference grid (T1 P, T2P, . . . , TNP).

In an embodiment, when the compressed data at T0 and difference grids are transmitted, the error grids can also be transmitted. For example, in an embodiment, computing device 102 can transmit the compressed data at T0 and difference grids to end user device 114a. In an embodiment, end user device 114a can use the error grids to recreate the original data sets. For example, in an embodiment, end user device 114a (e.g., using data compressor 116a and/or processor 118a) can calculate T1=T1P+T0E, T2=T2P+T1E, . . . , TN=TNP+T(N−1)E.

5.4. Exemplary Variations for Eliminating Growth of Error in Compressed Time Series Data In an embodiment, the T0 and TN grid sets can be used as bookend controls for the TX sets in between T0 and TN. In an embodiment, any number of intermediate TX sets can be used as support controls in the process to manage the error. In practice, the simple use of the T0 as the first control presents the most effective and efficient way to compensate for error.

5.5. Exemplary Advantages of Eliminating Growth of Error in Compressed Time Series Data Embodiments of the present disclosure use highly correlated data in a known configuration to improve compression, which has significant advantages over prior techniques. Most compression algorithms depend on unknown statistical correlations to achieve compression. Embodiments of the present disclosure control not only the original data but the lossy data to eliminate signal drift over time, take advantage of time correlations to compress data highly, completely eliminates time based drift. And can enable tuning of compression to actual weather events. Embodiments of the present disclosure make traditional, straight-forward DCT/QM/Entropy coding techniques practical for model data.

6. Exemplary Combination of Systems and Methods for Reducing Error in Data Compression and Decompression While embodiments of the present disclosure for variable block size compression for gridded data, efficiently storing null values in gridded data, and eliminating growth of error in compressed time series data have been described separately above (e.g., with reference to FIGS. 8, 10, and 12), it should be understood that systems and methods for reducing error in data compression and decompression in accordance with embodiments of the present disclosure can use none, a plurality, or all of these techniques when compressing and/or decompressing data. For example, in an embodiment, all three of the methods shown in FIGS. 8, 10, and 12 can be applied to a data set to be compressed (e.g., if the data set includes null values and time series data). In an embodiment, two of the above methods shown in FIGS. 8, 10, and 12 can be applied to a data set to be compressed. For example, in an embodiment, if a data set does not contain null values, the method of FIG. 10 is not applied, and if a data set does not contain time series data, the method of FIG. 12 is not applied.

Figure 13:
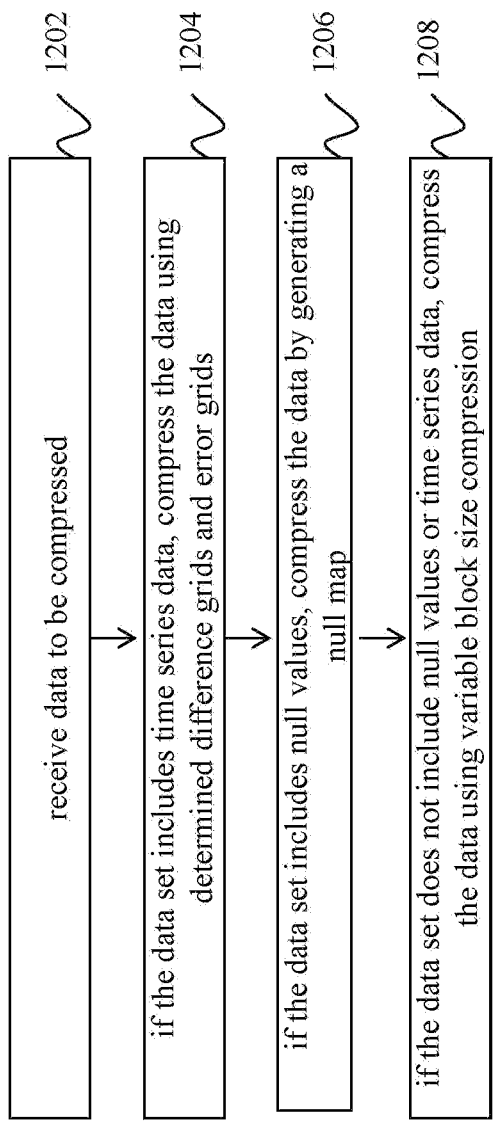
FIG. 13 is a flowchart of a method for determining how to reducing error in data compression in accordance with an embodiment of the present disclosure.

In an embodiment, a data compressor (e.g., data compressor 104) can determine which, if any, of the methods of FIGS. 8, 10, and 12 to apply. FIG. 13 is a flowchart of a method for determining how to reducing error in data compression in accordance with an embodiment of the present disclosure. In step 1202, data to be compressed is received. For example, in an embodiment, supercomputer 216 receives the data to be compressed (e.g., from satellite 204). In step 1204, if the data set includes time series data, the data is compressed using determined difference grids and error grids. For example, in an embodiment, supercomputer 216 (e.g., using data compressor 218 and/or processor 220) determines whether the data set includes time series data and, if so, compresses the data using the method of FIG. 12. In step 1206, if the data set includes null values, the data is compressed by generating a null map. For example, in an embodiment, supercomputer 216 (e.g., using data compressor 218 and/or processor 220) determines whether the data set includes null values, and if so, compresses the data using the method of FIG. 10. In step 1208, if the data set does not include null values or time series data, the data is compressed using variable block size compression. For example, in an embodiment, if supercomputer 216 (e.g., using data compressor 218 and/or processor 220) determines that the data set does not include time series data or null values, supercomputer 216 (e.g., using data compressor 218 and/or processor 220) compresses the data using the method of FIG. 8.

In an embodiment, similar methods can be used to decompress the data. For example, if ship 226a receives data to be decompressed from supercomputer 216, ship 226a can determine how to decompress the data based on the type of compressed data received. For example, if ship 226a receives an error grid with the compressed data, ship 226a can determine (e.g., using processor 230a and/or data compressor 228a) that the compressed data included time series data and can use the error grid to decompress the data as described above. In an embodiment, if ship 226a receives a null map with the compressed data, ship 226a can determine (e.g., using processor 230a and/or data compressor 228a) that the compressed data included null values and can use the null map to decompress the data as described above. Additionally, in an embodiment, a sending device (e.g., supercomputer 216) can be configured to send information (e.g., in a header) to a receiving device (e.g., ship 226a) instructing the receiving device how to decompress the compressed data.

7. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Any representative signal processing functions described herein can be implemented using computer processors, computer logic, application specific integrated circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g., software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A method, comprising:
   receiving, by a data compressor device, data to be compressed;
   determining, by the data compressor device, whether the data includes time series data or null values;
   responsive to determining that the data includes time series data, generating, by the data compressor device, a plurality of error grids and difference grids for a plurality of data sets at a corresponding plurality of time steps and compressing the data based on the error grids and the difference grids;
   responsive to determining that the data includes null values, generating, by the data compressor device, a null map based on a linear signal associated with the null values and compressing the data based on the null map; and
   responsive to determining that the data excludes time series data or null values, compressing, by the data compressor device, the data using variable block size compression based on a comparison of decompressed data to original data.

2. The method of claim 1, wherein the plurality of time steps comprise time steps from a first time step T0 in the plurality of time steps to a last time step TN in the plurality of time steps.

3. The method of claim 2, wherein the plurality of error grids correspond to each data set in the plurality of data sets at time steps T0 to T(N−1).

4. The method of claim 3, wherein the plurality of difference grids correspond to each data set in the plurality of data sets at time steps T1 to TN, and wherein generating the plurality of difference grids further comprises for each data set in the plurality of data sets at time steps T1 to TN, generating a corresponding difference grid by subtracting data in a corresponding error grid in the plurality of error grids at a previous time step from data in a corresponding data set in the plurality of data sets at a current time step.

5. The method of claim 1, further comprising replacing the null values in the data with a mean or median of values in a window of values comprising the null values and neighboring non-null values.

6. The method of claim 1, wherein the data comprises a plurality of data sets, and wherein generating the linear signal further comprises generating a linear signal for a first data set in the plurality of data sets based on null values in the first data set.

7. The method of claim 1, wherein compressing the data using variable block size compression based on a comparison of decompressed data to original data comprises:
   compressing the data into compressed data;
   decompressing the compressed data into decompressed data; and
   subdividing the data in response to a determination that a difference between the data and the decompressed data exceeds a predetermined threshold.

8. The method of claim 7, further comprising determining that a compression error has occurred for the data in response to the determination that the difference between the data and the decompressed data exceeds the predetermined threshold.

9. The method of claim 8, further comprising:
   determining that no compression error has occurred for the data in response to the determination that the difference between the data and the decompressed data did not exceed the predetermined threshold; and
   transmitting the compressed data in response to determining that no compression error has occurred for the data.

10. The method of claim 1, further comprising transmitting the generated compressed data to an end user device.

11. The method of claim 10, wherein the compressed data is transmitted over a low bandwidth communication link.

12. A device, comprising:
a processor;
a memory; and
a data compressor device, coupled to the processor and memory, configured to:
  receive data to be compressed;
  determine whether the data includes time series data or null values;
  responsive to determining that the data includes time series data, generate a plurality of error grids and difference grids for a plurality of data sets at a corresponding plurality of time steps and compress the data based on the error grids and the difference grids;
  responsive to determining that the data includes null values, generate a null map based on a linear signal associated with the null values and compress the data based on the null map; and
  responsive to determining that the data excludes time series data or null values, compress, by the data compressor device, the data using variable block size compression based on a comparison of decompressed data to original data.

13. The device of claim 12, wherein the plurality of time steps comprise time steps from a first time step T0 in the plurality of time steps to a last time step TN in the plurality of time steps.

14. The device of claim 13, wherein the plurality of error grids correspond to each data set in the plurality of data sets at time steps T0 to T(N−1).

15. The device of claim 14, wherein the plurality of difference grids correspond to each data set in the plurality of data sets at time steps T1 to TN, and wherein generating the plurality of difference grids further comprises for each data set in the plurality of data sets at time steps T1 to TN, generating a corresponding difference grid by subtracting data in a corresponding error grid in the plurality of error grids at a previous time step from data in a corresponding data set in the plurality of data sets at a current time step.

16. The device of claim 12, wherein the data compressor device is further configured to replace the null values in the data with a mean or median of values in a window of values comprising the null values and neighboring non-null values.

17. The device of claim 12, wherein the data comprises a plurality of data sets, and wherein generating the linear signal further comprises generating a linear signal for a first data set in the plurality of data sets based on null values in the first data set.

18. The device of claim 12, wherein compressing the data using variable block size compression based on a comparison of decompressed data to original data comprises:
  compressing the data into compressed data;
  decompressing the compressed data into decompressed data; and
  subdividing the data in response to a determination that a difference between the data and the decompressed data exceeds a predetermined threshold.

19. The device of claim 18, wherein the data compressor device is further configured to determine that a compression error has occurred for the data in response to the determination that the difference between the data and the decompressed data exceeds the predetermined threshold.

20. The device of claim 19, wherein the data compressor device is further configured to:
  determine that no compression error has occurred for the data in response to the determination that the difference between the data and the decompressed data did not exceed the predetermined threshold; and
  transmit the compressed data in response to determining that no compression error has occurred for the data.

21. The device of claim 12, wherein the data compressor device is further configured to transmit the generated compressed data to an end user device.

22. The device of claim 21, wherein the generated compressed data is transmitted over a low bandwidth communication link.

* * * * *